US006242939B1

(12) United States Patent
Nagasawa et al.

(10) Patent No.: US 6,242,939 B1
(45) Date of Patent: Jun. 5, 2001

(54) SUPERCONDUCTING CIRCUIT HAVING SUPERCONDUCTIVE CIRCUIT DEVICE OF VOLTAGE-TYPE LOGIC AND SUPERCONDUCTIVE CIRCUIT DEVICE OF FLUXOID-TYPE LOGIC DEVICE SELECTIVELY USED THEREIN

(75) Inventors: Shuichi Nagasawa; Kazunori Miyahara; Youichi Enomoto, all of Tokyo (JP)

(73) Assignees: NEC Corporation; International Superconductivity Technology Center, both of Tokyo (JP)

( * ) Notice: Subject to any disclaimer, the term of this patent is extended or adjusted under 35 U.S.C. 154(b) by 0 days.

(21) Appl. No.: 09/517,444

(22) Filed: Mar. 2, 2000

(30) Foreign Application Priority Data

| Mar. 5, 1999 | (JP) | ................................. 11-059376 |
| Mar. 5, 1999 | (JP) | ................................. 11-059414 |
| Mar. 5, 1999 | (JP) | ................................. 11-059454 |

(51) Int. Cl.$^7$ .......................... H03K 19/195; G11C 11/44
(52) U.S. Cl. ...................... 326/3; 326/6; 326/7; 365/160; 365/162
(58) Field of Search ........................... 326/1–7; 365/160, 365/162, 230.03, 230.06

(56) References Cited

U.S. PATENT DOCUMENTS

| 4,151,605 | * | 4/1979 | Faris | ...................................... 365/162 |
| 4,365,317 | * | 12/1982 | Gheewala | ............................. 365/162 |
| 4,611,132 | * | 9/1986 | Sone | ..................................... 307/462 |
| 5,099,152 | * | 3/1992 | Suzuki | ................................ 307/476 |
| 5,126,598 | * | 6/1992 | Kotani | ................................ 307/462 |
| 5,315,180 | * | 5/1994 | Kotani | ................................ 307/480 |
| 5,598,105 | * | 1/1997 | Kurosawa et al. | ...................... 326/6 |

FOREIGN PATENT DOCUMENTS 6-334512   12/1994   (JP) .

OTHER PUBLICATIONS

"A 380 ps. 9.5 mW Josephson 4–Kbit, RAM Operated at High Bit Yield", IEEE Trans. on Applied Superconductivity vol. 5, No. 2, pp. 2447–2452, Jun. 1995.
"RSFQ 1024–Bit Shift Register for Acquisition Memory", by O.A. Mukhanov, IEEE Trans. On Applied Superconductivity, vol. 3, No. 4, pp. 3102–3133, Dec. 1993.
"New RSFQ Circuits", by S.V. Polonsky, et al., IEEE Trans. on Application Superconductivity, vol. 3, No. 1, MAG–15, No. 1, pp. 408–411.
"A DC–Powered Josephson Flip–Flop", by A.F. Hebard, et al., IEEE Trans. on MAG., vol. 1, MAG–15, No. 1, pp. 408–411, 1979.

* cited by examiner

*Primary Examiner*—Michael Tokar
*Assistant Examiner*—Vibol Tan
(74) *Attorney, Agent, or Firm*—Scully, Scott, Murphy & Presser (57) ABSTRACT

A superconducting circuit device of a voltage-type logic device is large in current driving capability and, accordingly, electric power consumption; however, the switching speed is not so fast, and a superconducting circuit device of a fluxoid-type logic device is small in current driving capability and, accordingly, the electric power consumption; however the switching speed is faster than that of the superconducting circuit device of the voltage-type logic device, wherein the superconducting circuit device of the voltage-type logic device and the superconducting circuit device of the fluxoid-type logic device are selectively used in a superconducting circuit such as a superconducting random access memory, a superconducting NOR circuit and a superconducting signal converting circuit so as to realize small electric power consumption and high-speed switching action.

19 Claims, 9 Drawing Sheets

SUPERCONDUCTING CIRCUIT HAVING SUPERCONDUCTIVE CIRCUIT DEVICE OF VOLTAGE-TYPE LOGIC AND SUPERCONDUCTIVE CIRCUIT DEVICE OF FLUXOID-TYPE LOGIC DEVICE SELECTIVELY USED THEREIN

FIELD OF THE INVENTION

This invention relates to a superconducting circuit and, more particularly, to a superconducting circuit using a Josephson junction as a circuit device.

DESCRIPTION OF THE RELATED ART

An integrated circuit using the Josephson junctions is hereinbelow referred to as "superconducting integrated circuit". The superconducting integrated circuits are broken down into two categories. The first category is a voltage-type logic device, and uses the non-linearity of the voltage-to-current characteristics of the Josephson junction. The logic gates categorized in the voltage-type logic device achieves the logic functions already known in the semiconductor logic gates. Another category uses the non-linearlity of the current phase characteristics of the Josephson junction, and is called as "fluxoid type logic device".

A superconducting integrated circuit of the voltage-type logic device outputs a constant voltage for a constant period. The output potential level is changed between state "0" and state "1", and the state "0" and state "1" are usually corresponding to zero volt and predetermined volts. The superconducting integrated circuit is responsive to a potential so as to achieve a logic function, and the potential is hereinbelow referred to as "operating signal". The superconducting integrated circuit of the voltage-type logic device has a Josephson junction with the McCumber coefficient greater than 1, and the Josephson junction is in the under-damping state. The McCumber coefficient is expressed as $2\pi I_0 C R_D^2/\Phi_0$ where $I_0$ is the critical current value of the Josephson junction, C is capacitance, $R_D$ is resistance and $\Phi_0$ is the single flux quantum (see "Ultra High-Speed Josephson Device", page 38, published by Baihukan). The superconducting integrated circuit is used under the condition that the Josephson junction is biased with alternating current. When the Josephson junction in the voltage-type logic device is switched to the voltage state, the Josephson junction remains there. In order to return to the initial state, i.e., the superconductive state, it is necessary to change the bias current to zero. For this reason, the Josephson junction of the voltage-type logic device is called as "latching device".

On the other hand, a superconducting integrated circuit of the fluxoid type logic device outputs a SFQ (Single Flux Quantum) pulse, and achieves a logic function through propagation of the single flux quantum depending upon the quantum state. The operating signal applied to the fluxoid type logic device is called as "SFQ pulse signal". The superconducting integrated circuit has a Josephson junction with the McCumber coefficient equal to or less than 1, and the Josephson junction is in the over-damping state. The superconducting integrated circuit is used under the condition that the Josephson junction is biased with direct current. The fluxoid-type logic device achieves a logic function through propagation/storage of the SFQ pulse. The basic gate of the fluxoid-type logic device is operable as a kind of memory. For this reason, it is easy to form a superconducting integrated circuit in the pipeline architecture. Although plural flux quanta are used in a superconducting integrated circuit, the single flux quantum is a majority in the superconducting integrated circuits. For this reason, the fluxoid-type logic device is sometimes called as "SFQ device".

Various applications have been proposed. One of the applications is a superconducting random access memory. A typical example of the superconducting random access memory of the voltage-type logic device is disclosed in "A 380 ps, 9.5 mW Josephson 4-Kbit, RAM Operated at High Bit Yield", IEEE Trans. on Applied Superconductivity, vol. 5, No. 2, pages 2447–2452, June 1995. An example of the superconducting memory of the fluxoid-type logic device has one dimensional arrangement, because a two-dimensional array is hardly achieved. A superconducting shift-register is disclosed in "RSFQ 1024-bit Shift Register for Acquisition Memory", IEEE Trans. On Applied Superconductivity, vol. 3, No. 4, pages 3102–3133, December 1993. However, any superconducting random access memory of the fluxoid-type logic device has not been developed, yet.

Figure 1:
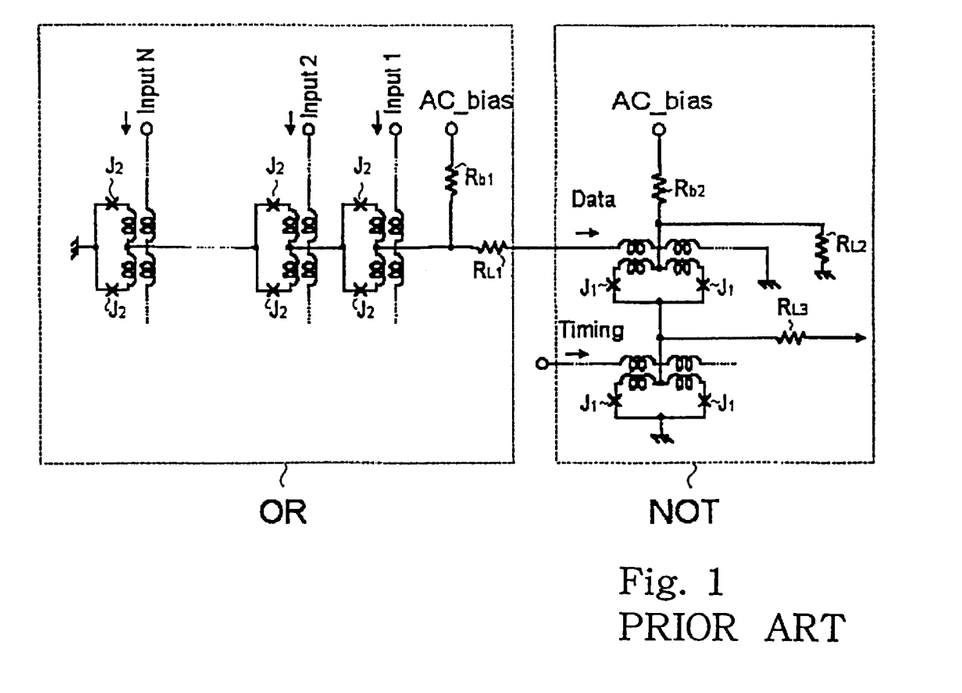
FIG. 1 is a circuit diagram showing the prior art superconducting NOR circuit of the voltage-type logic device.

Another application is a superconducting NOR circuit. As well known to a person skilled in the art, the NOR logic is achieved by the combination of the OR logic and the NOT logic. For this reason, the superconducting NOR circuit is implemented by the combination of a superconducting OR circuit and a superconducting NOT circuit.

typical example of the superconducting NOR circuit is shown in FIG. 1. The prior art superconducting NOR circuit comprises a Josephson magnetically coupled multi-input OR circuit OR and a superconducting NOT circuit NOT, which is a kind of superconducting quantum interference device. In FIG. 1, J1 and J2 are indicative of Josephson junctions, and bias feed resistors are labeled with Rb1 and Rb2. RL1, RL2 and RL3 designate load resistors.

The Josephson magnetically coupled multi-input OR circuit and the superconducting NOT circuit are categorized in the voltage-type logic device. The Josephson magnetically coupled multi-input OR circuit is disclosed in Japanese Patent Application No. 5-123676, and the superconducting quantum A interference device is usually abbreviated as "SQUID". The superconducting OR circuit OR is implemented by a series combination of magnetically coupled SQUIDs. Accordingly, the even if the number of input signals is increased, the increase of the input signals only results in the number of the magnetically coupled SQUIDs, and the bias current is not increased. Another attractive feature of the prior art superconducting NOR circuit is an integration of plural superconducting NOR circuits. The input signals are magnetically coupled, and, accordingly, the input signal lines are directly connected. As a result, plural superconducting NOR circuits are driven without increase of the input signal current.

A superconducting logic circuit of the fluxoid type logic device is operative under the direct current bias, and achieves a high-speed logic function. A superconducting NOR circuit of the fluxoid type logic device is also realized by using a single flux quantum OR circuit and a single flux quantum NOT circuit (see IEEE Trans. on Applied Superconductivity, vol. 3, No. 1, pages 2566–2577, March 1993).

Figure 2:
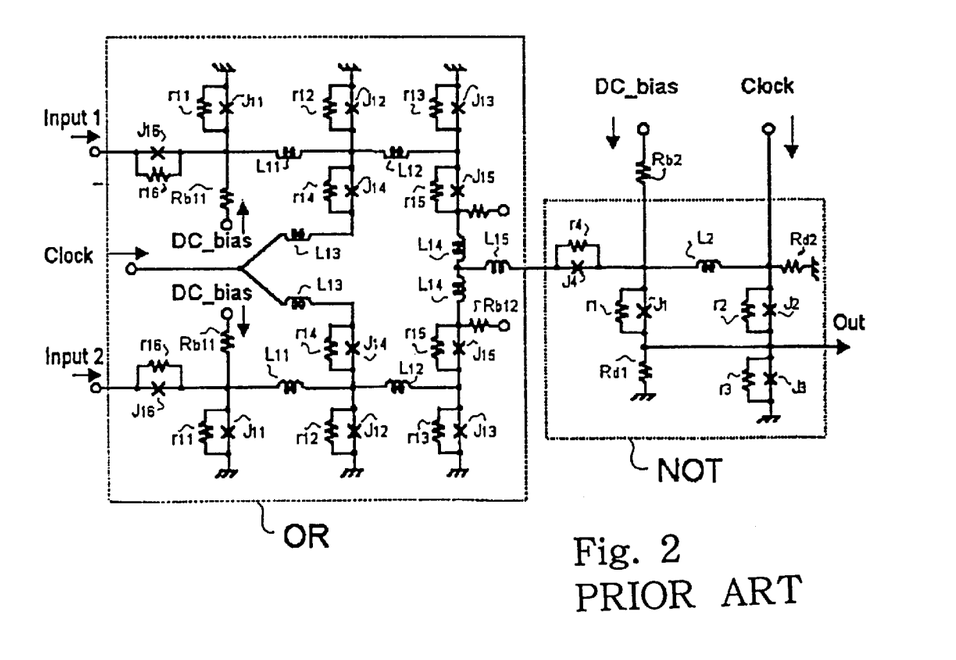
FIG. 2 is a circuit diagram showing the prior art superconducting NOR circuit of the fluxoid-type logic device.

FIG. 2 illustrates the prior art superconducting NOR circuit of the fluxoid type logic device. The prior art superconducting NOR circuit comprises a two-input single flux quantum superconducting OR circuit OR and a single flux quantum superconducting NOT circuit NOT. J1 to J4 and J11 to J16 designate Josephson junctions. Shunt resistors are labeled with r1 to r4 and r11 to r16. Rd1 and Rd2 are indicative of damping resistors, and Rb11 and Rb12 designate bias feed resistors. L2 and L11 to L15 are indicative of inductors. Direct current bias is applied through the bias feed resistors Rb11 and Rb2, and any alternating current is not required for the prior art superconducting NOR circuit.

Yet another application is a superconducting signal converter. The superconducting signal converter is incorporated in a superconducting integrated circuit, which includes both of the fluxoid-type logic device and the voltage-type logic device or both of the fluxoid-type logic device and a semiconductor circuit. The superconducting signal converter converts an output signal of the fluxoid-type logic device to an input signal of the voltage-type logic device, by way of example. In other words, the superconducting signal converter converts the SFQ pulse signal to the level signal.

A HUFFLE gate is biased with direct current as similar to the fluxoid type logic device, and outputs a level signal. Using the HUFFLE gate, the prior art superconducting signal converter is fabricated as disclosed in IEEE Trans. on Mag., vol. 1, MAG-15, No. 1, pages 408–411, 1979.

Figure 3:
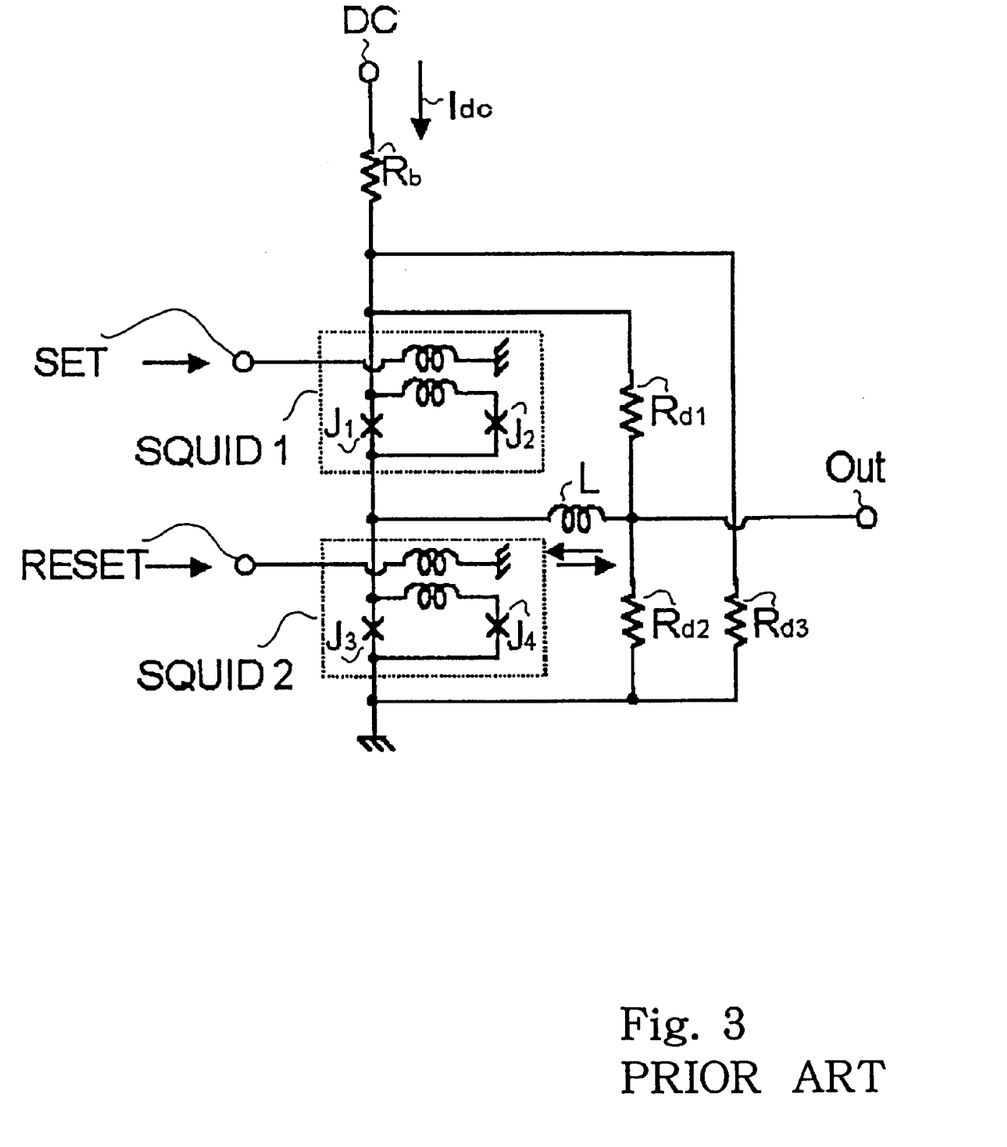
FIG. 3 is a circuit diagram showing the prior art superconducting signal converter.

FIG. 3 illustrates a typical example of the prior art signal converter using the HUFFLE gate. The prior art signal converter comprises superconducting quantum interference devices SQUID1 and SQUID2, an inductor L, damping resistors Rd1/Rd2/Rd3 and a bias feed resistor Rb. The superconducting quantum interference device SQUID1 has Josephson junctions J1/J2, and the other superconducting quantum interference device SQUID2 includes Josephson junctions J3/J4. The superconducting quantum interference devices SQUID1/SQUID2 are biased with direct current Idc. An SFQ pulse is supplied from a set terminal SET to the superconducting quantum interference device SQUID1, and changes the superconducting quantum interference device SQUID1 to the voltage state. Then, most of the bias current Idc flows through the damping resistor Rd1, the inductor L and the other superconducting quantum interference device SQUID2 to the ground. The current passing through the inductor L does not change the direction until the SFQ pulse is applied to a reset terminal RESET. When the SFQ pulse is applied to the reset terminal RESET, the other superconducting quantum interference device SQUID2 enters the voltage state, and the superconducting quantum interference device SQUID1 is recovered to the superconductive state. Most of the bias current Idc flows through the superconducting quantum interference device SQUID1, the inductor L and the damping resistor Rd2 to the ground. Thus, the superconducting quantum interference device SQUID2 changes the current passing through the inductor L to the opposite direction, and the current keeps the direction until the SFQ pulse is applied to the set terminal SET. The current passing through the inductor L serves as the level signal at an output terminal Out.

Following problems are encountered in the above-described superconducting circuits. First, the prior art superconducting random access memory of the voltage-type logic device is implemented by the latching devices, and the latching devices requires a large amount of high-frequency alternating current bias. The high-frequency alternating current bias is of the order of several GHz. If the data storage capacity is increased, the prior art superconducting random access memory consumes the high-frequency alternating current bias at several amperes. Thus, the problem inherent in the prior art superconducting random access memory of the voltage-type logic device is a large amount of electric power consumption.

Although the prior art superconducting random access memory of the fluxoid type logic device is superior in the high-speed operation and the electric power consumption than the prior art superconducting random access memory of the voltage-type logic device, it is difficult to arrange the memory cells in matrix. Thus, the problem inherent in the prior art superconducting random access memory is the layout of memory cells.

The prior art superconducting NOR circuit of the voltage-type logic device also has a problem in the large amount of power consumption as similar to the prior art superconducting random access memory of the voltage-type logic device. The reason for the large amount of power consumption is the alternating current bias. The problem becomes serious when a large number of superconducting NOR gates are integrated together.

The prior art superconducting NOR circuit of the fluxoid-type logic device shown in FIG. 2 is operative on two input signals Input1/Input2, and the circuit configuration sets the input signals on two. When more than two input signals are NORed with one another, the superconducting OR circuits are multiplied depending upon the input signals to be ORed. This results in a large number of circuit components and a large amount of power consumption. Moreover, the input signals are injected directly to the junctions J16, and a large amount of current is required for the input signals. Thus, the problem inherent in the prior art superconducting NOR circuit is the large amount of power consumption.

A problem inherent in the prior art superconducting signal converter shown in FIG. 3 is the operating speed. As described hereinbefore, the HUFFLE gate is used in the prior art signal converter, and the HUFFLE gate requires a large inductance at the inductor L for a stable operation. This results in a large time constant L/R, and the large time constant L/R decelerate the propagation of the level signal. Another problem inherent in the HUFFLE gate is latch-up phenomenon. Both of the superconducting quantum interference devices SQUID1/SQUID2 simultaneously enter the voltage state in the latch-up phenomenon, and the prior art superconducting signal converter can not respond to the SFQ pulses. When the resistance at the damping resistor Rd3 is regulated to an appropriate value, the prior art superconducting signal converter is prevented from the latch-up phenomenon. However, the regulation causes the operating voltage and the operation margin to be small. Moreover, the small operating voltage decelerates the signal conversion. Yet another problem is that a signal source consumes a large amount of current for the SFQ pulse. This is because of the fact that the input gates of the superconducting quantum interference devices SQUID1/SQUID2 are magnetically coupled to each other. This means that the prior art superconducting signal converter is low in sensitivity. Still another problem is that the prior art superconducting signal converter requires the set signal and the reset signal.

SUMMARY OF THE INVENTION

It is therefore an important object of the present invention to provide a superconducting circuit, which has the applications free from the problems inherent in the corresponding prior art applications.

To accomplish the object, the present invention proposes to use a hybrid configuration between superconducting single flux quantum devices and superconducting latching devices.

In accordance with one aspect of the present invention, there is provided a superconducting random access memory comprising plural memory cell blocks each including plural random access memory cells and a first peripheral circuit used for selectively accessing data stored in the plural random access memory cells, the first peripheral circuit having a decoder circuit formed by using superconducting single flux quantum devices biased with direct current and producing decoded address signals from an address signal and a driver circuit formed by using superconducting latching devices biased with alternating current and connected between the decoder circuit and the plural random access memory cells so as to render the plural random access memory cells selectively accessible, the superconducting random access memory further comprises a second peripheral circuit associated with the plural random access memory blocks and including a block decoder rendering the plural random access memory blocks selectively accessible and plural block driver circuits formed by using superconducting latching devices and connected at least between the block decoder and the plural random access memory blocks for propagating decoded signals from the block decoder to the plural random access memory blocks and signal propagation lines connected between the plural block driver circuits, and impedance matching is achieved between the signal propagation lines and the plural block driver circuits.

In accordance with another aspect of the present invention, there is provided a superconducting NOR circuit comprising a superconducting OR circuit including a first output node, plural input nodes respectively supplied with plural input signals and plural superconducting quantum interference devices coupled in series between the first output node and a constant voltage source and magnetically coupled to the plural input nodes, respectively, each of the plural superconducting quantum interference devices including a superconductive loop having at least two Josephson junctions and first inductors, a bias feed resistor connected between a source of direct bias current and the first output node, a series combination of a load resistor and a second inductor connected to the first output node and a superconducting NOT circuit including an input connected to the series combination and a second output node for producing an output signal representative of the NOR logic between the plural input signals.

In accordance with yet another aspect of the present invention, there is provided a superconducting signal converting circuit comprising a first Josephson junction having a first node connected to a signal input node and a second node connected to a ground terminal and operative in an over-damping state at a first McCumber coefficient equal to or less than 1, a second Josephson junction having a third node connected to a signal output node and a fourth node connected to the ground terminal and operative in an under-damping state at a second McCumber coefficient greater than 1, a series combination of a third Josephson junction and an inductor having a fifth node connected to the signal input node and a sixth node connected to the signal output node, the third Josephson junction being operative in an under-damping state at the second McCumber coefficient greater than 1, a first bias node supplying a direct bias current to the signal input node, and a second bias node supplying an alternating bias current to the signal output node. In accordance with still another aspect of the present invention, there is provided a superconducting signal converting circuit comprising a first Josephson junction having a first node connected to a signal input node and a second node connected to a ground terminal and operative in an over-damping state at a first McCumber coefficient equal to or less than 1, a second Josephson junction having a third node connected a fourth node and a fifth node connected to the ground terminal and operative in an under-damping state at a second McCumber coefficient greater than 1, a third Josephson junction having a sixth node connected to a signal output node and a seventh node connected to the ground terminal and operative in the under-damping state at the second McCumber coefficient greater than 1, a series combination of an inductor and a fourth Josephson junction having an eight node connected to the signal input node and a ninth node connected to the fourth node, the fourth Josephson junction being operative in the under-damping state at the second McCumber coefficient greater than 1, a first resistor having a tenth node connected to the fourth node and an eleventh node connected to a twelfth node, a second resistor having a thirteenth node connected to the twelfth node and a fourteenth node connected to the signal output node, a third resistor having a fifteenth node connected to the fourth node and a sixteenth node connected to the output node, a first bias node supplying a direct bias current to the signal input node, and a second bias node supplying an alternating bias current to the twelfth node.

BRIEF DESCRIPTION OF THE DRAWINGS

The features and advantages of the superconducting circuit will be more clearly understood from the following description taken in conjunction with the accompanying drawings in which.

DESCRIPTION OF THE PREFERRED EMBODIMENTS

FIRST EMBODIMENT

Figure 4:
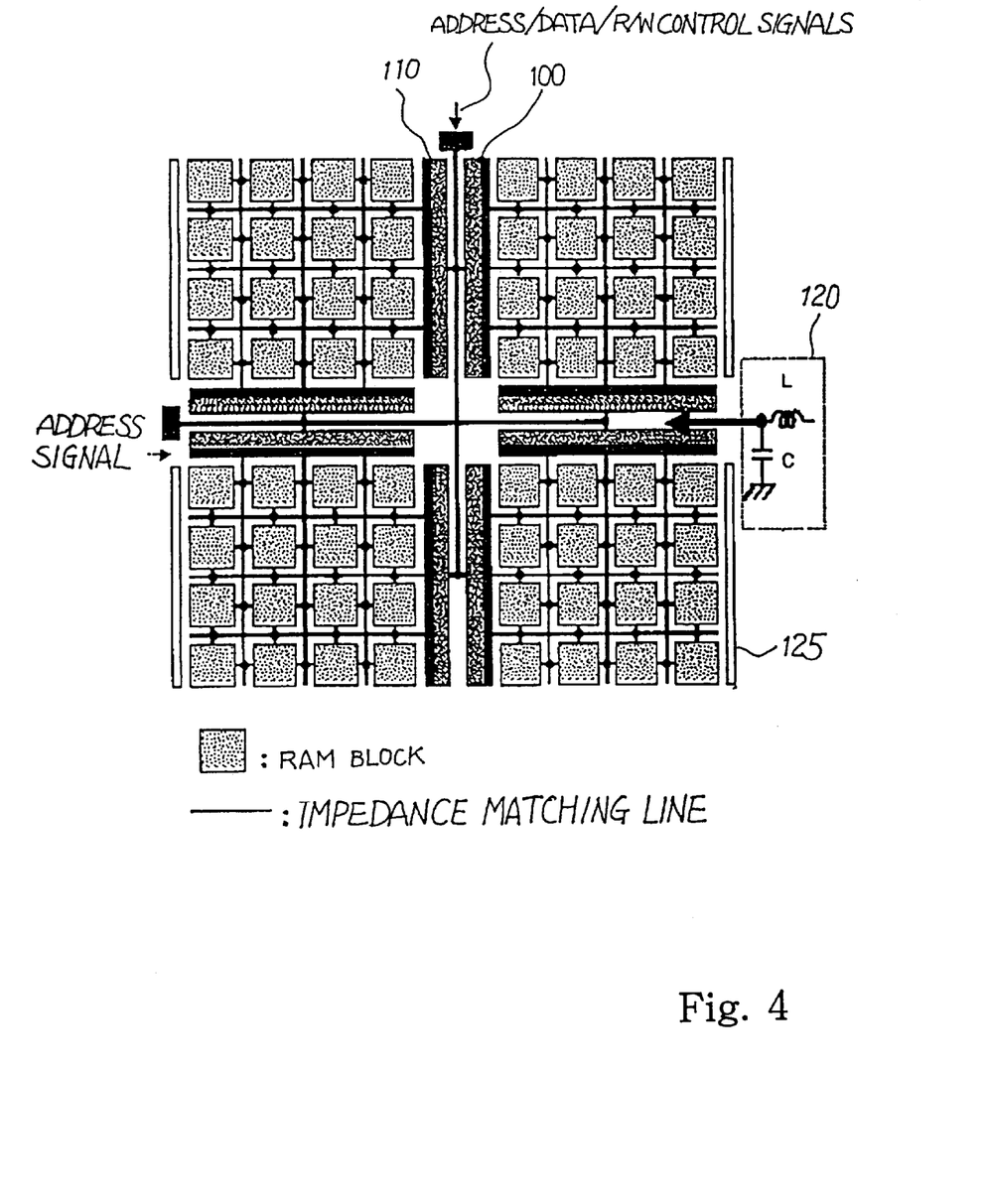
FIG. 4 is a plane view showing the layout of components forming parts of a superconducting random access memory according to the present invention.

FIG. 4 illustrates a 16-kilobit superconducting latching/SFQ hybrid random access memory embodying the present invention. The superconducting random access memory comprises sixty-four random access memory blocks arranged in eight rows and eight columns. Small squares respectively stand for the random access memory blocks in FIG. 4. The sixty-four random access memory blocks are divided into four sub-arrays, and, accordingly, sixteen random access memory blocks form each of the sub-arrays. The four sub-arrays are spaced from one another. Each of the random access memory block includes 256 memory cells.

The superconducting random access memory further comprises a block decoder circuits 100 of the voltage-type logic device, block driver circuits 110 of the voltage-type logic device, an LC oscillation circuit 120, block sense circuits of the voltage-type logic device and signal propagating lines. The block decoder circuits 100 are responsive to a block address signal so as to render the random access memory blocks selectively accessible. The block driver circuits 110 propagates signals between the random access memory blocks at high-speed. The block driver circuits 110 propagate the decoded block address signals from the block decoder circuit 100 to the random access memory blocks through the signal propagation lines. The block driver circuit 110 is expected to drive a large amount of inductance, and the voltage-type logic device is appropriate to the driver circuits 110. The LC oscillation circuit 120 serves as a powering circuit, which is also labeled with reference numeral 120. The powering circuit 120 is composed of an LC-resonant circuit that supplies the alternating current for the latching devices. In other words, the LC-resonant circuit acts as an impedance transformer for supplying the high-frequency alternating bias current. The alternating current is used for biasing components of the voltage-type logic device. The block sense circuit 125 determines the logic level of a read-out data signal. The signal propagating lines are connected between the block driver circuits 110, and the impedance is matched between the block driver circuits 110 and the signal propagation lines. As a result, the level signals are propagated at a high-speed. A multi-driver scheme is employed due to a limit on the data storage capacity of each random access memory block, and the signals are propagated in parallel to the plural random access memory blocks.

Though not shown in FIG. 4, plural superconducting signal converters are further incorporated in the superconducting random access memory. The superconducting signal inverter converts the SFQ pulses to the level signals.

Figure 5:
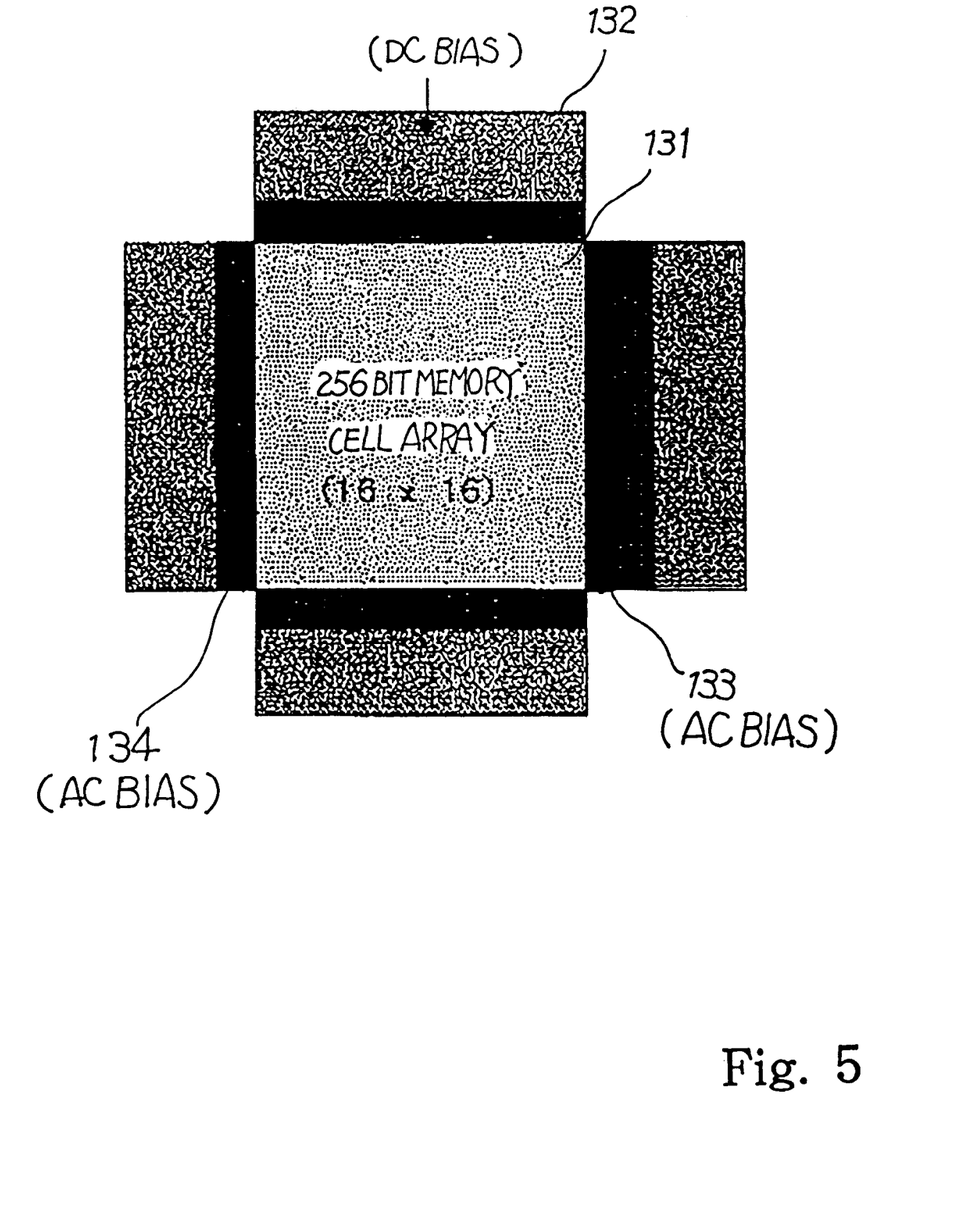
FIG. 5 is a plane view showing the layout of circuits in a random access memory block.

The random access memory block has a 256-bit memory cell array 131, a decoder circuit 132 of the fluxoid type logic device, a sense circuit 133 of the voltage-type logic device and a driver circuit 134 of the voltage-type logic device as shown in FIG. 5. The superconducting latching devices form the driver circuit 134 and the sense circuit 133, and alternating current bias is applied to the driver circuit 134 and the sense circuit 133. The driver circuits 134 are expected to drive word lines and bit lines (not shown), and the sense circuits 133 are expected to drive sense lines (not shown). These lines have a large amount of inductance. In this situation, the latching devices are appropriate to the driver circuits 134 and the sense circuits 133, because the latching device is larger in current driving capability than the SFQ device. On the other hand, the SFQ devices form the decoder circuit 132, and direct current bias is applied to the decoder circuit 132. The 256 memory cell array 131 is implemented by superconducting devices of the voltage-type logic device such as, for example, the superconducting latching devices. For this reason, the 256-bit memory cell array 131 is arranged in sixteen rows and sixteen columns. The decoder circuit 132, the sense circuit 133 and the driver circuit 134 are arranged around the 256-bit memory cell array 131. In this instance, the driver circuit 134 is clocked at 10 GHz, and, accordingly, the 10 GHz clock signal sets a limit on the data storage capacity of the memory cell array 131. Through not shown in FIG. 5, the driver circuit 134 is connected through word lines and bit lines to the random access memory cells 131, and the random access memory cells 131 are connected through drmdr lines to the sense circuit 133. The decoder circuit 132 is expected to decode the address signal.

As described hereinbefore, the decoder circuit 132 is constituted by the SFQ devices. The SFQ device circuit is much smaller in power consumption than the latching device. If the decoder circuit 132 is implemented by a voltage-type logic device circuit, the decoder circuits 132 consumes 70 percent of the total alternating current. The decoder circuits 132 is constituted by the SFQ devices, which drastically reduces the consumption of the alternating current. Although the multi-driver scheme is employed in the superconducting random access memory, the total power consumption is allowable.

Figure 6:
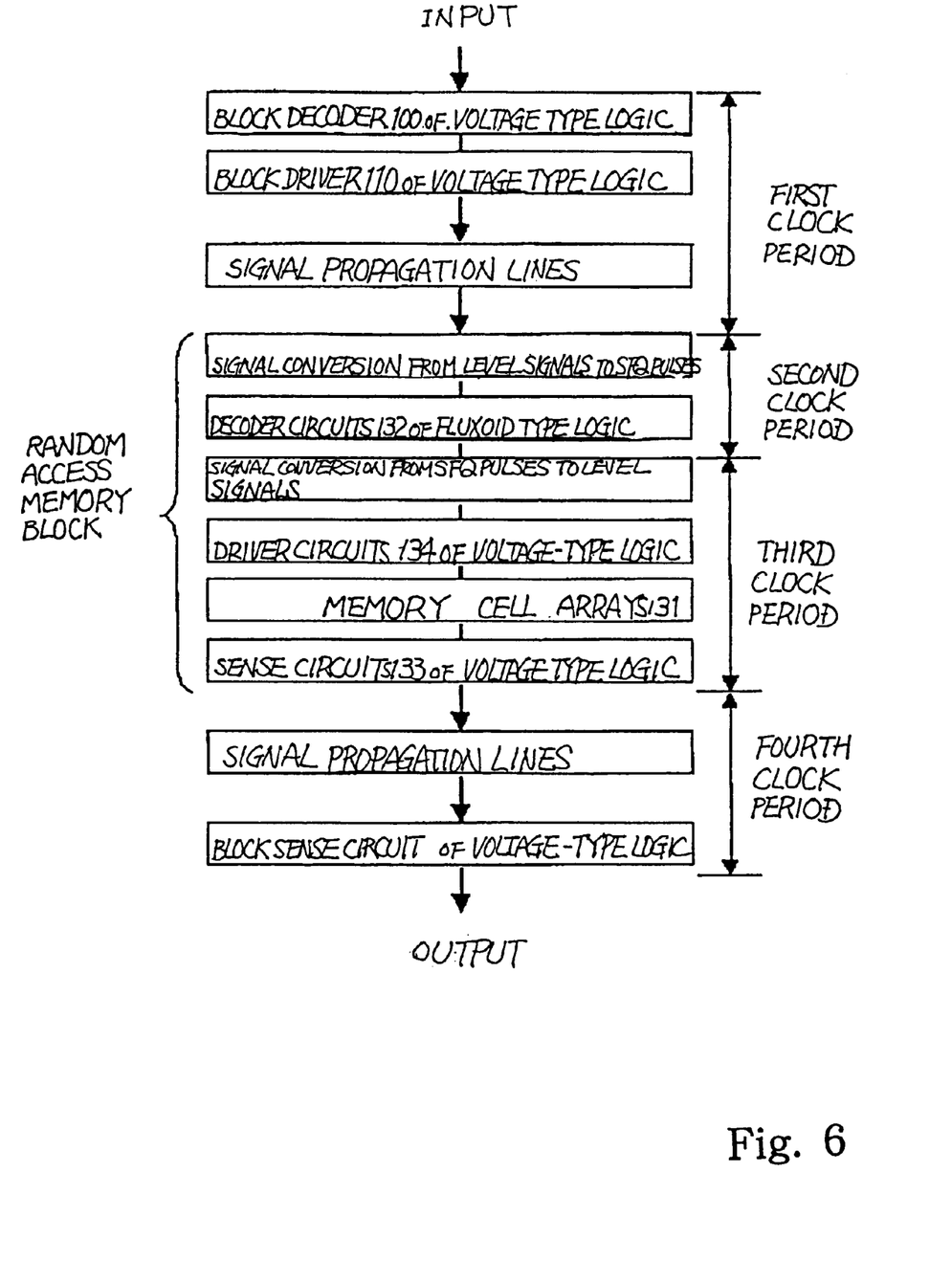
FIG. 6 is a block diagram showing a pipeline signal propagation in the superconducting random access memory.

In this instance, the superconducting random access memory is operative in a pipeline fashion. FIG. 6 illustrates the pipeline signal propagation in the superconducting random access memory. An input signal such as address/data/read-write control signals are propagated through the block decoder circuits 100, the block driver circuits 110 and the signal propagation lines to the random access memory blocks in the first clock period.

In the second clock period, the superconducting signal converters convert the input level signals to SFQ pulses, and the SFQ pulses are applied to the decoder circuits 132 constituted by the SFQ devices for the high-speed signal decoding.

In the third clock period, the superconducting signal converters convert the SFQ pulses to the level signals, and the driver circuits 134 constituted by the latching devices, the memory cell arrays 131 and the sense circuits are sequentially activated.

In the fourth clock period, the read-out data signals are propagated through the signal propagation lines to the block sense circuit 125, and the block sense circuit 125 constituted by the latching devices is finally activated.

Thus, the four-stage pipeline architecture is realized in the superconducting random access memory according to the present invention, and achieves a high-speed data access.

As will be appreciated from the foregoing description, the superconducting random access memory has the hybrid configuration between the superconducting SFQ devices and the superconducting latching devices. The superconducting SFQ device is smaller in power consumption that the superconducting latching device, and the superconducting latching device is larger in current driving capability than the superconducting SFQ device. In this application, the decoder circuits 132 consumes a large amount of current, and the superconducting SFQ devices are used in the decoder circuits 132 On the other hand, the sense circuits 133 and the driver circuits 134/110 require a large current driving capability, and the superconducting latching devices are used in those circuits. Thus, the two kinds of superconducting devices are selectively used for the component circuits of the superconducting random access memory. Moreover, the pipeline architecture accelerates the data access. As a result, the superconducting random access memory achieves a high-speed data access without increase the power consumption.

SECOND EMBODIMENT

Figure 7:
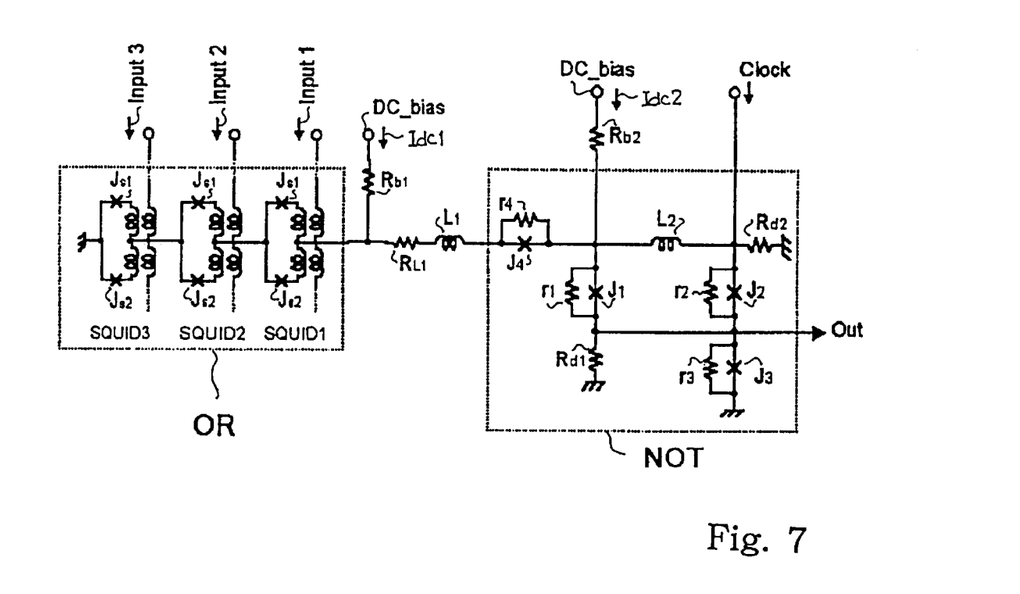
FIG. 7 is a circuit diagram showing a superconducting NOR circuit according to the present invention.

FIG. 7 illustrates a superconducting NOR gate embodying the present invention. The superconducting NOR circuit comprises a magnetically coupled multi-input superconducting OR circuit OR, a superconducting NOT circuit NOT, bias feed resistors Rb1/Rb2, a load resistor RL1 and an inductor L1. The superconducting OR gate OR is connected through the bias feed resistor Rb1 to a source of direct bias current, and the superconducting NOT circuit NOT is connected through the bias feed resistor Rb2 to the source of direct bias current. The source of direct bias current supplies direct bias current Idc1 to the superconducting OR circuit OR and direct bias current Idc2 to the superconducting NOT circuit NOT.

The superconducting OR circuit OR includes superconducting quantum interference devices SQUID1/SQUID2/SQUID3, and the superconducting quantum interference devices SQUID1/SQUID2/SQUID3 are coupled in series between the load resistor RL1 and the ground. The superconducting quantum interference devices SQUID1/SQUID2/SQUID3 are similar in circuit configuration to one another, and each quantum interference device SQUID1/SQUID2/SQUID3 has a pair of Josephson junctions Js1/Js2 and inductors, and the Josephson junctions Js1/Js2 and the inductors form a superconductive loop. The Josephson junctions Js1/Js2 have appropriate junction characteristics, which causes the Josephson junctions Js1/Js2 to operate in the under-damping state, i.e., the McCumber coefficient $\beta$ is greater than 1. The quantum interference devices SQUID1/SQUID2/SQUID3 are magnetically coupled to input nodes, respectively, and input signals Input1/Input2/Input3 are supplied to the input nodes, respectively.

On the other hand, the superconducting NOT circuit NOT includes Josephson junctions J1/J2/J3/J4, shunt resistors r1/r2/r3/r4 for the Josephson junctions J1/J2/J3/J4, damping resistors Rd1/Rd2 and an inductor L2. An output node is provided between the parallel combination of the shunt resistor r2/Josephson junction J2 and the parallel combination of the shunt resistor r3/Josephson junction J3. The shunt resistors r1/r2/r3/r4 are regulated in such a manner that the associated Josephson junctions J1/J2/J3/J4 are operative in the over-damping state, i.e., the McCumber coefficient , is equal to or less than 1.

Figure 8:
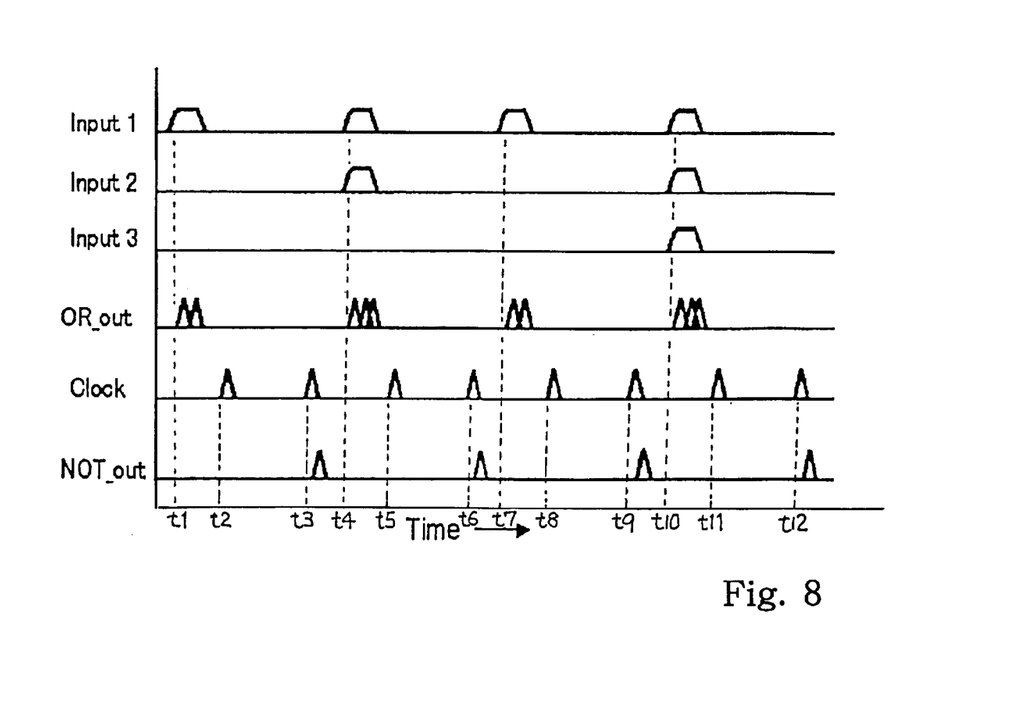
FIG. 8 is a graph showing waveforms of signals observed in a simulation on the superconducting NOR gate.

In this instance, the superconducting NOR circuit has the following circuit parameters. J1=0.276 mA, J2=0.23 mA, J3=0.3 mA, J4=0.177 mA, Js1=0.125 mA, Js2=0.125 mA, L1=10 pH, L2=9.5 pH, r1=1.4 ohms, r2=1.6 ohms, r3=1.2 ohms, r4=2.1 ohms, RL1=1.0 ohm, Rd1=0.5 ohm, Rd2=0.5 ohm, Rb1=57.7 ohms, Rb2=11.5 ohms, Idc1=0.19 mA, Idc2=0.24 mA FIG. 8 illustrates the waveforms of the signals observed in a simulation on the superconducting NOR gate. The input signals Input1/Input2/Input3 are assumed to be the level signal supplied form a latching logic, and keep the potential level at a certain level for a predetermined period. The input signal Input1 rises at t1, t4, t7, t10, the input signal Input2 rises at time t4, t10, and the input signal Input3 rises at time t10. As a result, the associated superconducting quantum interference device or devices SQUID1/SQUID2/SQUID3 are switched to the voltage state. Then, the source DC_bias of direct bias current is isolated from the ground, and the direct bias current Idc1 flows through the load resistor RL1 and the inductance L1 into the superconducting NOT circuit NOT. The superconducting OR gate generates at least one single flux quantum. As a result, the superconducting OR gate raises the output signal OR_out at t1, t4, t7, t10. Thus, when any one of the input signals Input1/Input2/Input3 rises, the superconducting OR gate OR raises the output signal OR_out. After the generation of the at least one single flux quantum, the superconducting quantum interference device or devices are reset to the superconductive state, because the load resistor RL1 and the inductor L1 are appropriately designed. Thus, the superconducting OR circuit OR has a selfreset mode. The number of single flux quantums is variable depending upon the input signals Input1/Input2/Input3 and the magnitude thereof. In this instance, two or three single flux quantums are output from the superconducting OR circuit OR.

The superconducting NOT circuit NOT is clocked at t2, t3, t5, t6, t8, t9, t11 and t12, and raises the output signal NOT_out at t3, t6, t9 and t12. When the superconducting OR circuit OR supplies the SFQ pulse or pulses to the superconducting NOT circuit NOT, the superconducting NOT circuit NOT keeps the output signal NOT_out low. On the other hand, when the superconducting OR circuit OR keeps the output signal OR_out low, the superconducting NOT circuit NOT raises the output signal NOT_out. Thus, the superconducting NOT circuit NOT raises the output signal NOT_out in the absence of the output signal OR_out. Even if an SFQ pulse reaches the superconducting NOT circuit NOT between the clock pulse and the previous clock pulse, the superconducting NOT circuit NOT keeps the output signal NOT_out in the previous state. Thus, the clock pulse prevents the superconducting NOT circuit NOT from a logical error.

As will be appreciated from the foregoing description, the superconducting NOR circuit is implemented by more than two superconducting quantum interference devices connected in series. Therefore, the superconducting NOR circuit according to the present invention is responsive to more than two input signals. The OR circuit is constituted by serially connected superconducting SQUIDs each including under-damping junctions Js1 and Js2 which are latching junctions. However, to enable operation of the OR circuit with the direct current power, it is designed to function with a self-resetting mode determined by the value of the resistor RL1. Therefore, alternating current power is not required in this NOR circuit.

THIRD EMBODIMENT

Figure 9:
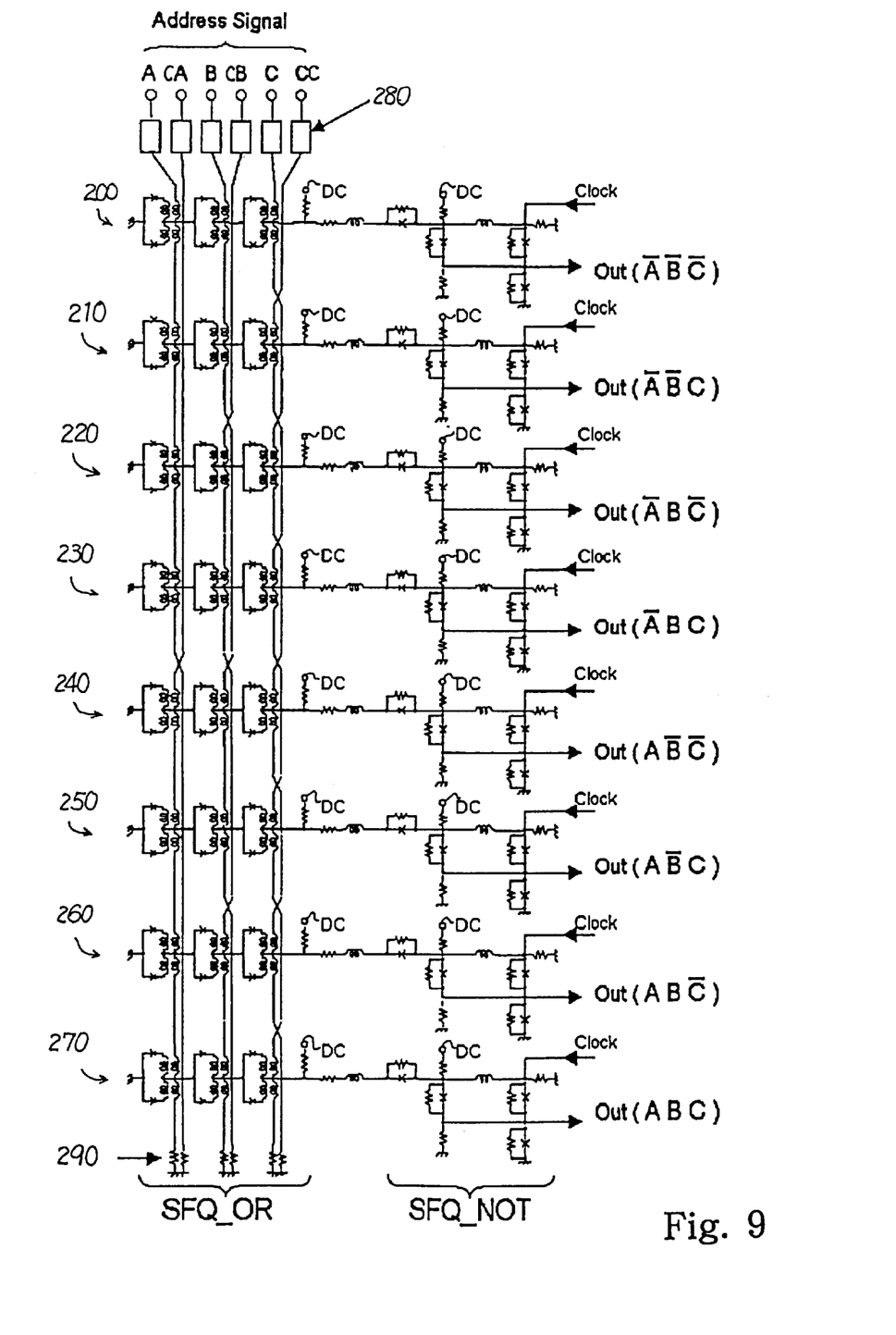
FIG. 9 is a circuit diagram showing a superconducting signal decoder circuit according to the present invention.

FIG. 9 illustrates a superconducting decoder circuit embodying the present invention. The superconducting decoder circuit comprises eight superconducting NOR circuits 200/210/220/230/240/250/260/270, superconducting driver circuits 280 and terminating resistors 290, and, accordingly, eight superconducting OR circuits SFQ_OR and eight superconducting NOT circuits SFQ_NOT form the superconducting NOR circuits 200 to 270 as similar to the superconducting NOR circuit shown in FIG. 7.

All the superconducting NOR circuits 200 to 270 are biased with direct current, and all the superconducting driver circuits 280 are biased with alternating current. Thus, the superconducting NOR circuits 200 to 270 are constituted by the SFQ devices, and the superconducting driver circuits 280 are constituted by the latching devices. A three-bit address signal A/B/C and inverted address bits CA/CB/CC are supplied to the driver circuits 280, and the driver circuits 280 are selectively connected to the superconducting NOR circuits 200–270. Namely, signal lines are connected from the driver circuits 280 through the terminating resistors 290 to the ground, and the superconducting OR circuits SFQ_OR are selectively connected to the signal lines. Each of the superconducting driver circuits 280 are expected to inject a signal current into the associated signal line having a large amount of inductance, and the latching device is appropriate to the superconducting driver circuits 280.

In FIG. 9, the output signals Out are respectively accompanied with the combinations of address bits/inverted address bits, and the inverted bits CA/CB/CC are expressed as A with over-line, B with over-line and C with over-line, respectively.

The superconducting decoder circuit behaves as follows. The three-bit address signal A/B/C and the inverted address bits CA/CB/CC are supplied to the superconducting driver circuits 280, and the superconducting driver circuits 280 selectively drive the six signal lines to the active voltage level. The three address bits A/B/C and the inverted address bits CA/CB/CC form eight combinations, and the eight combinations are respectively assigned to the eight superconducting NOR circuits 200–270. The signal lines are magnetically coupled to the superconducting quantum interference devices of the eight superconducting OR circuits SFQ__OR.

Only one combination keeps the three superconducting quantum interference devices of the associated superconducting OR circuit SFQ__OR in the superconductive state, and the associated superconducting NOT circuit SFQ__NOT generates the output pulse. For example, the signal lines assigned to the inverted bits CA/CB and the address bit C are not magnetically coupled to the superconducting OR gate SFQ__OR of the superconducting NOR circuit 210. For this reason, when the driver circuits 280 change the inverted address bits CA/CB and the address bit C to the active voltage level, the three superconducting quantum interference devices of the superconducting NOR gate 210 are in the superconductive state, and the direct bias current still flows into the ground. As a result, the superconducting OR circuit SFQ__OR does not output any SFQ pulse, and the associated superconducting NOT circuit SFQ__NOT generates the output pulse.

As will be understood, the superconducting NOR circuits 200 to 270 form the superconducting decoder circuit, and the driver circuits 280 constituted by the latching devices drives the signal lines at high-speed.

FOURTH EMBODIMENT

Figure 10:
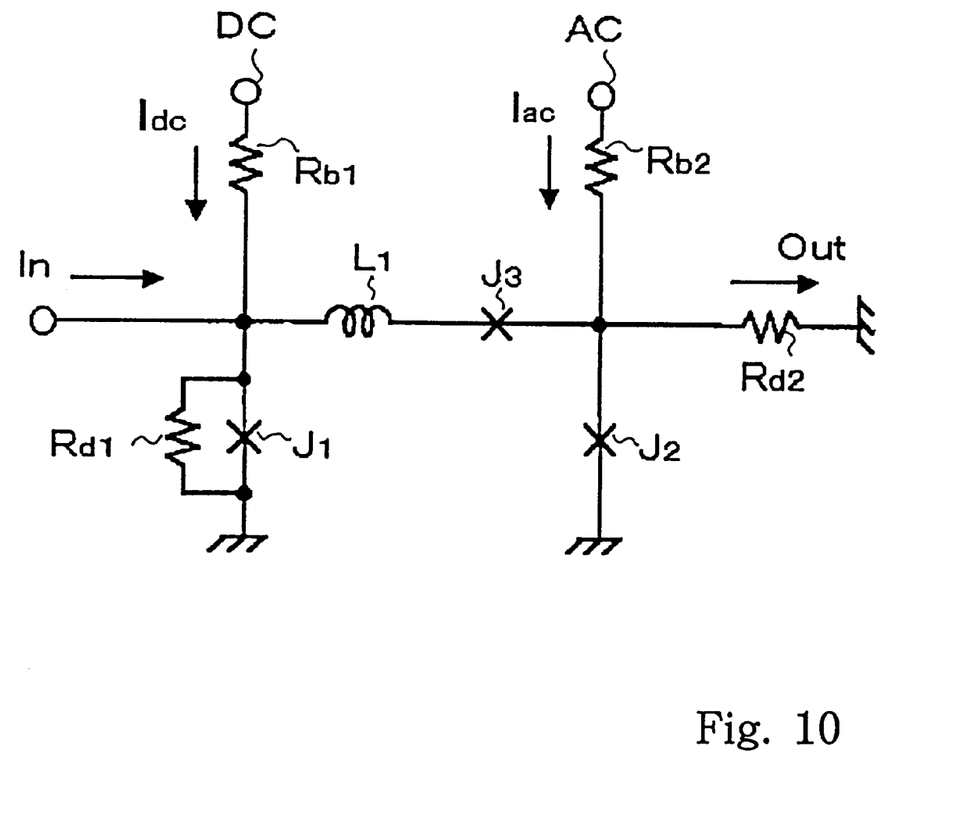
FIG. 10 is a circuit diagram showing a superconducting signal converting circuit according to the present invention.

FIG. 10 illustrates a superconducting signal converting circuit embodying the present invention. The superconducting signal converting circuit comprises Josephson junctions J1/J2/J3, damping resistors Rd1/Rd2, an inductor L1 and bias feed resistors Rb1/Rb2. The series combination of the inductor L1, the Josephson junction J3 and the damping resistor Rd2 is connected between an input node and the ground, and an input signal In is supplied to the input node. The input signal is SFQ pulses. Although the damping resistor Rd2 is grounded at one end thereof, the grounded end serves as an output node, which is connected to an input node of the next stage. An output signal Out is obtained at the output node, and is a level signal.

A source DC of direct bias current is connected to the bias feed resistor Rb1, and direct bias current Idc flows from the source DC through the bias feed resistor Rb1 to the parallel combination of the damping resistor Rd1 and the Josephson junction J1. The parallel combination of the damping resistor Rd1 and the Josephson junction J1 is grounded. On the other hand, a source AC of alternating bias current is connected to the bias feed resistor Rb2, and alternating bias current Iac flows from the source AC through the Josephson junction J2 to the ground.

The damping resistor Rd1 is adjusted to an appropriate value so that the Josephson junction J1 operates in the over-damping state, i.e., the McCumber coefficient β is equal to or less than 1. On the other hand, the other damping resistor Rd2 is adjusted to an appropriate value so that the Josephson junction J2 is operative in the under-damping state, i.e., the McCumber coefficient β is greater than 1. The superconducting signal converter has the following circuit parameters, by way of example. J1=0.25 mA, J2=0.15 mA, J3=0.18 mA, L1=4 pH, Rd1=1.5 ohms, Rd2=20 ohms, Rb1=14 ohms, Rb2=93 ohms, Idc=0.2 mA, Iac=0.12 mA The inductor L1 and the Josephson junctions J1/J2/J3 form a superconductive loop, the LI product of which is of the order of $0.29\Phi_0$ on the basis of L =4 pH and I=0.15 mA. L is the inductance of the inductor L1, and I is the minimum superconductive critical current selected from the superconductive critical currents of the three Josephson junctions J1/J2/J3. The LI product may be less than the single flux quantum $\Phi_0$. If the LI product is less than the single flux quantum $\Phi_0$, the superconductive loop amplifies the waveheight of the input SFQ pulse.

Figure 11:
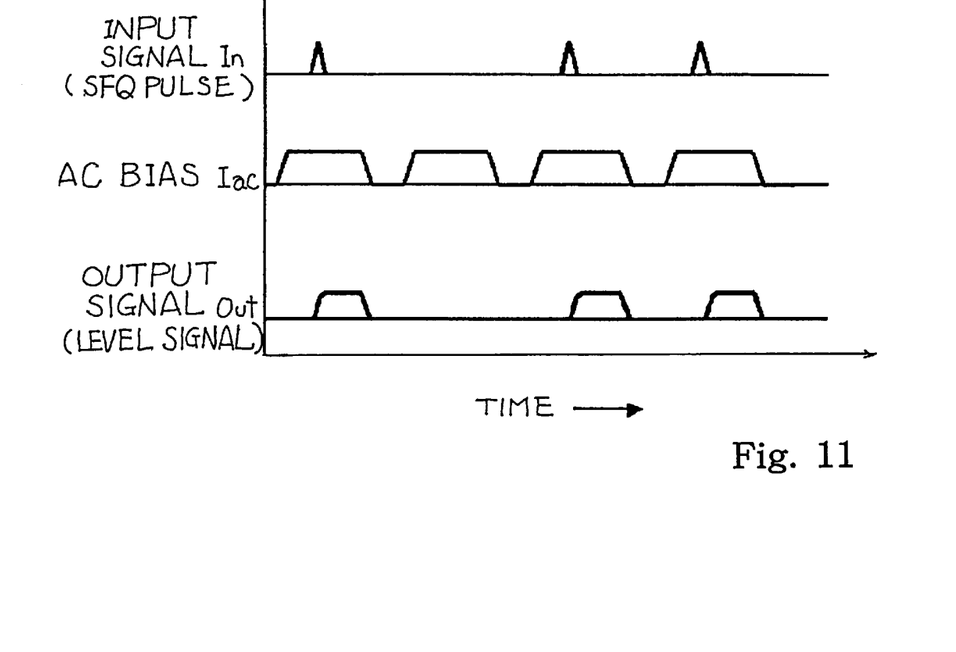
FIG. 11 is a graph showing waveforms of signals observed in a simulation on the superconducting signal converting circuit.

FIG. 11 shows the waveforms of the signals in terms of time, and the waveforms are a result of simulation on the superconducting signal converter. When the SFQ pulse is supplied to the input node, the superconductive loop, which consists of the Josephson junctions J1/J2/J3 and the inductor L1, amplifies the current of the SFQ pulse. When the amplified SFQ pulse is input to the Josephson junction J2, the Josephson junction J2 is switched to the voltage state, and raises the output signal Out. As described hereinbefore, the damping resistor Rd2 is designed to make the Josephson junction J2 operative in the under-damping state. For this reason, the Josephson junction J2 remains in the voltage state until the alternating bias current is decreased to zero. Thus, the output signal Out rises at the input of the SFQ pulse, and falls together with the alternating bias current Iac.

The supeconductive loop amplifies the wave-height of the SFQ pulse, and, accordingly, enhances the input sensitivity of the superconducting signal converting circuit. The enhancement of the input sensitivity results in a wide operation range of the alternating bias current Iac, and, accordingly, the superconducting signal converting circuit has a wide operation margin. Although the prior art HUFFLE gate requires a large inductive load, the superconducting signal converting circuit does not require the large inductive load, and the operation speed is improved.

As will be understood from the foregoing description, the superconducting signal converting circuit according to the present invention has the high input sensitivity, the wide operation margin and the high operation speed.

Although the damping resistor Rd1 and the damping resistor Rd2 cause the Josephson junction J1 and the Josephson junctions J2/J3 to operate in the over-damping state with the McCumber coefficient of the order of 1 and in the under-damping state with the McCumber coefficient of tens, respectively. However, when the Josephson junctions J1/J2/J3 are formed of high-temperature superconducting, the Josephson junctions J1 and J2/J3 per se realize the above values of the McCumber coefficient. As a result, the damping resistors Rd1/Rd2 are deleted from the superconducting signal converting circuit.

FIFTH EMBODIMENT

Figure 12:
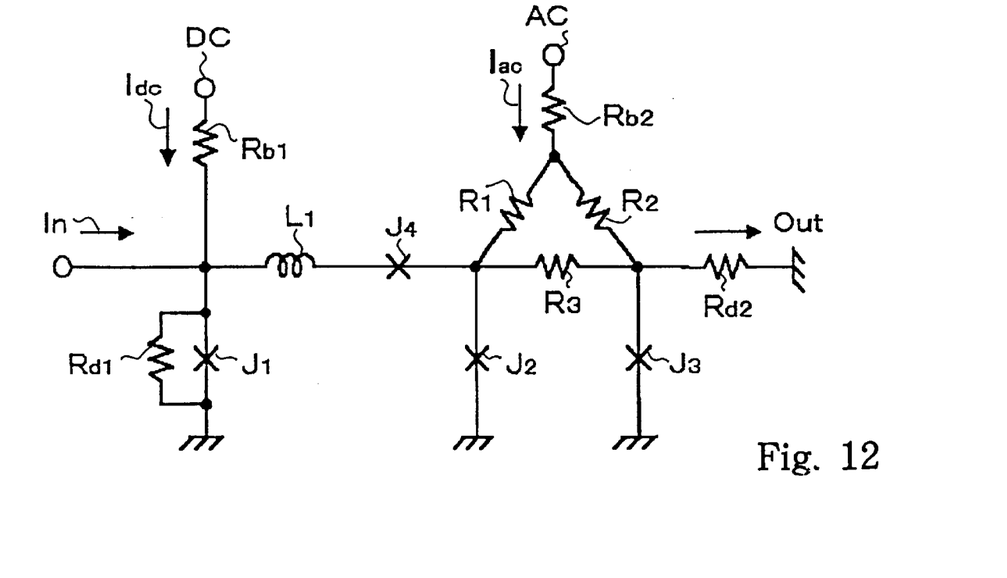
FIG. 12 is a circuit diagram showing another superconducting signal converting circuit according to the present invention.

FIG. 12 illustrates another superconducting signal converting circuit embodying the present invention. The superconducting signal converting circuit comprises Josephson junctions J1/J2/J3/J4, damping resistors Rd1/Rd2, an inductor L1, bias feed resistors Rb1/Rb2 and branching resistors R1/R2/R3. The damping resistor Rd2 is grounded as similar to the fourth embodiment, and an output signal Out is taken out from the grounded end of the damping resistor Rd2. A source DC supplies direct bias current through the bias feed resistor Rb1 to the Josephson junction J1, and a source AC supplies alternating bias current through the bias feed resistor Rb2 and the branching resistors R1/R2 to the Josephson junctions J2/J3.

The damping resistor Rd1 causes the Josephson junction J1 to operate in the over-damping state, i.e., the McCumber coefficient β is equal to or less than 1. On the other hand, the other damping resistor Rd2 causes the Josephson junctions J2/J3 to operate in the under-damping state, i.e., the McCumber coefficient β is greater than 1.

The superconducting signal converting circuit has the following circuit parameters, by way of example. J1=0.25 mA, J2=0.15 mA, J3=0.15 mA, J4=0.18 mA, L1=4 pH, Rd1=1.5 ohms, Rd2=10 ohms, Rb1=14 ohms, Rb2=47 ohms, R1=R2=R3=1 ohm, Idc=0.2 mA, Iac=0.24 mA The inductor L1 and the Josephson junctions J1/J2/J3 form a superconductive loop, the LI product of which is of the order of $0.29\Phi_0$ on the basis of L=4 pH and I=0.15 mA. L is the inductance of the inductor L1, and I is the minimum superconductive critical current selected from the superconductive critical currents of the three Josephson junctions J1/J2/J4. The LI product may be less than a half of the single flux quantum $\Phi_0$. The LI product may be less than the single flux quantum $\Phi_0$. If the LI product is less than the single flux quantum $\Phi_0$, the superconductive loop amplifies the wave-height of the input SFQ pulse.

The superconducting signal converting circuit implementing the fifth embodiment behaves as similar to the superconducting signal converting circuit implementing the fourth embodiment, and achieves the advantages described in conjunction with the fourth embodiment. The superconducting signal converting circuit shown in FIG. 12 generates the output level signal Out twice as much as that of the superconducting signal converting circuit shown in FIG. 10. In other words, if an input SFQ pulse is supplied to the input nodes of both superconducting signal converting circuits, the superconducting signal converting circuit shown in FIG. 12 generates the output signal Out twice as much in the output current as the output signal Out of the superconducting signal converting circuit shown in FIG. 10. This results in the input sensitivity twice as strong as that of the superconducting signal converting circuit shown in FIG. 10.

As will be understood from the foregoing description, the superconducting signal converting circuit according to the present invention has the high input sensitivity, the wide operation margin and the high operation speed.

Although the damping resistor Rd1 and the damping resistor Rd2 cause the Josephson junction J1 and the Josephson junctions J2/J3/J4 to operate in the over-damping state with the McCumber coefficient of the order of 1 and in the under-damping state with the McCumber coefficient of tens, respectively. However, when the Josephson junctions J1/J2/J3/J4 are formed of high-temperature superconducting, the Josephson junctions J1 and J2/J3/J4 per se realize the above values of the McCumber coefficient. As a result, the damping resistors Rd1/Rd2 are deleted from the superconducting signal converting circuit.

Although particular embodiments of the present invention have been shown and described, it will be apparent to those skilled in the art that various changes and modifications may be made without departing from the spirit and scope of the present invention.

For example, the memory cells of the superconducting latching devices may be replaced with semiconductor memory cells. If a large data storage capacity is required, the random access memorys shown in FIG. 4 may be arranged in matrix.

Two superconducting quantum interference devices or more than three quantum interference devices may form a superconducting OR circuit.

What is claimed is:

1. A superconducting random access memory comprising:

plural memory cell blocks each including plural random access memory cells and a first peripheral circuit used for selectively accessing data stored in said plural random access memory cells, said first peripheral circuit having a decoder circuit formed by using superconducting single flux quantum devices biased with direct current and producing decoded address signals from an address signal, and a driver circuit formed by using superconducting latching devices biased with alternating current and connected between said decoder circuit and said plural random access memory cells so as to render said plural random access memory cells selectively accessible;

a second peripheral circuit associated with said plural random access memory blocks, and including a block decoder rendering said plural random access memory blocks selectively accessible, and plural block driver circuits formed by using superconducting latching devices and connected at least between said block decoder and said plural random access memory blocks for propagating decoded signals from said block decoder to said plural random access memory blocks; and signal propagation lines connected between said plural block driver circuits, impedance matching being achieved between said signal propagation lines and said plural block driver circuits.

2. The superconducting random access memory as set forth in claim 1, further comprising a superconducting signal converter connected at least between said decoder circuit and said driver circuit for converting an output signal of selected ones of said superconducting single flux quantum devices to an input signal of selected ones of superconducting latching devices.

3. The superconducting random access memory as set forth in claim 1, in which said second peripheral circuit further includes a block sense circuit connected to said plural random access memory block.

4. The superconducting random access memory as set forth in claim 3, in which said block decoder, said block driver, said signal propagation lines, said decoder circuit, said driver circuit, said plural random access memory cells and said block sense circuit form parts of a pipeline.

5. The superconducting random access memory as set forth in claim 1, further comprising an impedance converting circuit generating said alternating current.

6. A superconducting NOR circuit comprising a superconducting OR circuit including a first output node, plural input nodes respectively supplied with plural input signals and plural superconducting quantum interference devices coupled in series between said first output node and a constant voltage source and magnetically coupled to said plural input nodes, respectively, each of said plural superconducting quantum interference devices including a superconductive loop having at least two Josephson junctions and first inductors, a bias feed resistor connected between a source of direct bias current and said first output node, a series combination of a load resistor and a second inductor connected to said first output node, and a superconducting NOT circuit including an input connected to said series combination and a second output node for producing an output signal representative of the NOR logic between said plural input signals.

7. The superconducting NOR circuit as set forth in claim 6, in which said superconducting OR circuit outputs at least one single flux quantum pulse when at least one of said plural input signals is changed to logic "1" level, and said superconducting NOT circuit is formed by using superconducting circuit devices of fluxoid-type logic device biased with a direct bias current so as to output a single flux quantum pulse from said second output node in the absence of said at least one signal flux quantum pulse.

8. The superconducting NOR circuit as set forth in claim 7, in which said superconducting NOT circuit further has a clock node supplied with a clock pulse, and is enabled with said clock pulse of an active level for responding said at least one single flux quantum pulse.

9. The superconducting NOR circuit as set forth in claim 7, in which all the Josephson junctions of said plural superconducting quantum interference devices have McCumber coefficient greater than 1 so as to operate in an under-damping state, and all the Josephson junctions in said superconducting NOT circuit have said McCumber coefficient equal to or less than 1 so as to operate in an over-damping state.

10. The superconducting NOR circuit as set forth in claim 6, in which said series combination of said load resistor and said second inductor offers a self-reset function to said superconducting OR gate so as to automatically change each of said plural superconducting quantum interference devices from a superconductive state to a voltage state.

11. The superconducting NOR circuit as set forth in claim 6, a superconducting signal decoder is formed by using plural superconducting NOR circuits each similar in circuit configuration to said superconducting NOR circuit.

12. A superconducting signal converting circuit comprising a first Josephson junction having a first node connected to a signal input node and a second node connected to a ground terminal and operative in an over-damping state at a first McCumber coefficient equal to or less than 1, a second Josephson junction having a third node connected to a signal output node and a fourth node connected to said ground terminal and operative in an under-damping state at a second McCumber coefficient greater than 1, a series combination of a third Josephson junction and an inductor having a fifth node connected to said signal input node and a sixth node connected to said signal output node, said third Josephson junction being operative in an under-damping state at said second McCumber coefficient greater than 1, a first bias node supplying a direct bias current to said signal input node, and a second bias node supplying an alternating bias current to said signal output node.

13. The superconducting signal converting circuit as set forth in claim 12, in which said third Josephson junction flows a superconductive critical current more than that of said second Josephson junction.

14. The superconducting signal converting circuit as set forth in 12, in which said inductor, said first Josephson junction, said second Josephson junction and said third Josephson junction form a superconductive loop having an LI product equal to or less than a single flux quantum where L is an inductance of said inductor and I is the minimum superconductive critical current selected from superconductive critical currents of said first, second and third Josephson junctions.

15. The superconducting signal converting circuit as set forth in claim 12, further comprising a first damping resistor connected in parallel to said first Josephson junction and having a first resistance causing said first Josephson junction to operate in said over-damping state, and a second damping resistor connected between said signal output node and said ground terminal and having a second resistance causing said second Josephson junction and said third Josephson junction to operate in said under-damping state.

16. A superconducting signal converting circuit comprising a first Josephson junction having a first node connected to a signal input node and a second node connected to a ground terminal and operative in an over-damping state at a first McCumber coefficient equal to or less than 1, a second Josephson junction having a third node connected a fourth node and a fifth node connected to said ground terminal and operative in an under-damping state at a second McCumber coefficient greater than 1, a third Josephson junction having a sixth node connected to a signal output node and a seventh node connected to said ground terminal and operative in said under-damping state at said second McCumber coefficient greater than 1, a series combination of an inductor and a fourth Josephson junction having an eight node connected to said signal input node and a ninth node connected to said fourth node, said fourth Josephson junction being operative in said under-damping state at said second McCumber coefficient greater than 1, a first resistor having a tenth node connected to said fourth node and an eleventh node connected to a twelfth node, a second resistor having a thirteenth node connected to said twelfth node and a fourteenth node connected to said signal output node, a third resistor having a fifteenth node connected to said fourth node and a sixteenth node connected to said output node, a first bias node supplying a direct bias current to said signal input node, and a second bias node supplying an alternating bias current to said twelfth node.

17. The superconducting signal converting circuit as set forth in claim 16, in which said fourth Josephson junction flows a superconductive critical current more than that of said second Josephson junction.

18. The superconducting signal converting circuit as set forth in 16, in which said inductor, said first Josephson junction, said second Josephson junction and said fourth Josephson junction form a superconductive loop having an LI product equal to or less than a single flux quantum where L is an inductance of said inductor and I is the minimum superconductive critical current selected from superconductive critical currents of said first, second and fourth Josephson junctions.

19. The superconducting signal converting circuit as set forth in claim 16, further comprising a first damping resistor connected in parallel to said first Josephson junction and having a first resistance causing said first Josephson junction to operate in said over-damping state, and a second damping resistor connected between said signal output node and said ground terminal and having a second resistance causing said second Josephson junction, said third Josephson junction and said fourth Josephson junction to operate in said under-damping state.

* * * * *